United States Patent [19]
An et al.

[11] Patent Number: 6,165,849
[45] Date of Patent: Dec. 26, 2000

[54] METHOD OF MANUFACTURING MOSFET WITH DIFFERENTIAL GATE OXIDE THICKNESS ON THE SAME IC CHIP

[75] Inventors: Judy X. An, San Jose; Bin Yu, Santa Clara, both of Calif.

[73] Assignee: Advanced Micro Devices, Inc., Sunnyvale, Calif.

[21] Appl. No.: 09/205,616

[22] Filed: Dec. 4, 1998

[51] Int. Cl.[7] .................................................. H01L 21/336
[52] U.S. Cl. ........................... 438/275; 438/279; 438/528
[58] Field of Search .................................. 438/528, 279, 438/275

[56] References Cited

U.S. PATENT DOCUMENTS

| | | | |
|---|---|---|---|
| 4,663,827 | 5/1987 | Nakahara | 438/301 |
| 4,710,265 | 12/1987 | Hotta | 438/433 |
| 5,047,358 | 9/1991 | Kosiak et al. | 437/34 |
| 5,254,487 | 10/1993 | Tamagawa | 437/34 |
| 5,480,828 | 1/1996 | Hsu et al. | 438/275 |
| 5,672,521 | 9/1997 | Barsan et al. | 438/276 |
| 5,920,779 | 7/1999 | Sun et al. | 438/275 |

*Primary Examiner*—Brian Dutton
*Assistant Examiner*—Brook Kebede

[57] ABSTRACT

A semiconductor device is formed having a low voltage transistor in a logic core portion and a high voltage transistor in an input/output portion. The low voltage transistor is formed by ion implanting nitrogen into the surface and forming a gate oxide layer on the nitrogen implanted surface portion of the semiconductor substrate in the logic core region. The implanted nitrogen retards the growth of the gate oxide layer in the nitrogen implanted area, thereby enabling formation of gate oxide layers having different thicknesses.

6 Claims, 3 Drawing Sheets

METHOD OF MANUFACTURING MOSFET WITH DIFFERENTIAL GATE OXIDE THICKNESS ON THE SAME IC CHIP

FIELD OF THE INVENTION

The present invention relates generally, to a semiconductor device, a logic core region and an input/output region on the same IC chip, and to a method of manufacturing the semiconductor device. The invention has particular applicability in semiconductor devices designed for high-density CMOS devices comprising a high voltage MOSFET and a low voltage MOSFET on the same IC chip.

BACKGROUND OF THE INVENTION

The escalating requirements for high density and performance associated with ultra large scale integration semiconductor devices requires submicron design features, high reliability and increased manufacturing throughput for competitiveness. Conventional practices are primarily based upon a silicon gate CMOS process wherein a gate electrode and corresponding source and drain regions formed by self alignment, and the withstand voltage (threshold voltage) determined by the impurity concentration level of the drain region.

Conventional practices also comprise forming, on a single chip, both low voltage transistors in internal logic circuitry for miniaturization and high-speed operation and high voltage transistors input/output (I/O) circuits for interface with exterior devices. Conventionally, the high voltage transistors are obtained by providing a low diffusion density in the drain region, the low voltage transistors are obtained by providing a high diffusion density in the drain region.

Transistors in I/O circuitry structure require gate oxide layers of a relatively high thickness, e.g., to withstand a relatively high voltage, such as about 7–8 volts for electrostatic discharge protection. However, due to miniaturization, the gate oxide layers of transistors in the logic core region are reduced in thickness below that necessary for optimum I/O gate oxide performance. In other words, the drive to increase density requires production worthy techniques for forming transistors having differential gate oxide thicknesses on a single chip.

Techniques for obtaining the high and low voltage transistors on a single chip are described in U.S. Pat. No. 5,254,487 and U.S. Pat. No. 5,047,358. However, such methodologies are complex as requiring plural masking and implanting steps in addition to implanting steps to adjust the threshold voltage of low voltage transistors and high voltage transistors.

There is a need for simplified, efficient and production worthy methodology enabling the formation of both high voltage CMOS and low voltage CMOS transistors on a single chip.

DISCLOSURE OF THE INVENTION

An advantage of the present invention is a simplified method of manufacturing a semiconductor device having transistors with differential gate oxide thicknesses on the same chip.

Another advantage of the present invention is a semiconductor device having transistors with differential gate oxide thicknesses on the same chip.

Additional advantages and other features of the present invention will be set forth in part in the description which follows and will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantage are achieved in part by a method of manufacturing a semiconductor device, the method comprising: forming a first mask on a main surface of a semiconductor substrate exposing a portion of a logic core gate region and a portion of an I/O region; ion implanting nitrogen into the surface of the semiconductor substrate in the logic core region; and forming a first oxide layer on the nitrogen implanted surface portion of the semiconductor substrate in the logic core region and a second oxide layer on the I/O portion of the semiconductor substrate, wherein the second oxide layer having a thickness greater than that of the first oxide layer.

Another aspect of the present invention is a semiconductor comprising: a substrate; a logic core region formed in the substrate and containing a first transistor comprising a gate electrode and a gate oxide layer thereunder having a first thickness; and an I/O region formed in the substrate and containing a second transistor comprising a gate electrode and a gate oxide layer thereunder having a second thickness greater than the first thickness.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF THE DRAWINGS

In FIGS. 1A to 2E, illustrate similar features denoted by similar reference numerals.

DESCRIPTION OF THE INVENTION

The present invention provides efficient methodology which enables the manufacture of semiconductor devices comprising a low voltage transistor formed in a logic core portion and a high voltage transistor formed in an I/O portion on the same chip. That object is achieved by simplified methodology which does not require the use of complicated masking and ion implantation steps.

Figure 1A:
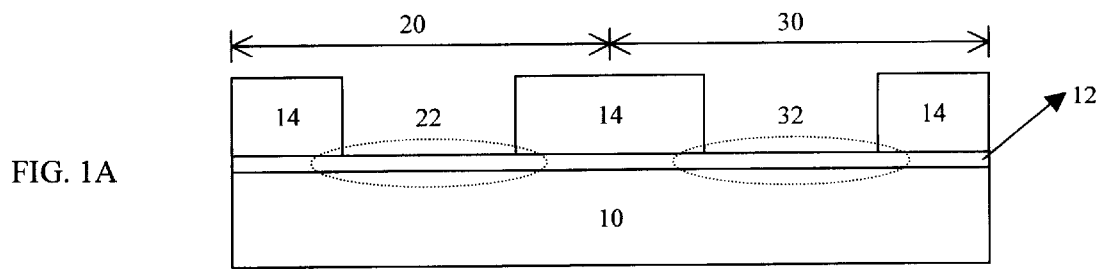
FIGS. 1A to 1G illustrate sequential phases of a method according to an embodiment of the present invention.

In accordance with an embodiment of the present invention, a semiconductor device in its intermediate fabrication stage is shown in FIG. 1A, wherein a logic core portion 20 and an I/O portion 30 are formed on a predetermined region of a surface of the semiconductor substrate 10, which semiconductor substrate 10 is typically monocrystalline silicon doped with a p-type or an n-type impurity. A first oxide layer or pad-oxide layer 12 is formed on the semiconductor substrate 10 as at a thickness of about 10 Å to about 20 Å as by conventional thermal oxidation. After formation of the pad oxide layer 12, a first mask layer 14, e.g., a conventional photoresist (PR) layer, is formed on the pad oxide layer 12, patterned and etched by conventional photolithographic and etching techniques to form a mask defining first opening 22 in the logic core portion 20 and a second opening 32 in the I/O portion 30. The first and second openings 22, 32 define areas in which gate oxides are subsequently formed by thermal oxidation. Active regions (source and drain regions) are subsequently formed in the surface of the semiconductor substrate 10 under the PR mask layer 14.

Figure 1B:
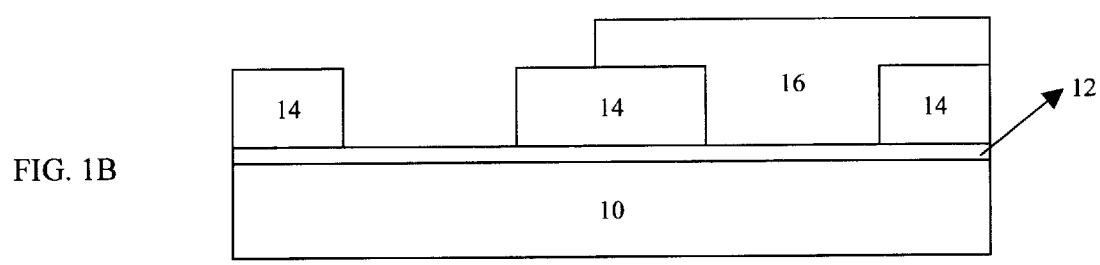

As shown in the FIG. 1B, a nitride layer, e.g., silicon nitride, or another PR layer is deposited, patterned and etched in a conventional manner to form a second mask layer 16 selectively on the surface of the I/O portion 30, covering the second opening 32 and on the upper surface of the PR mask layer 14.

Figure 1C:
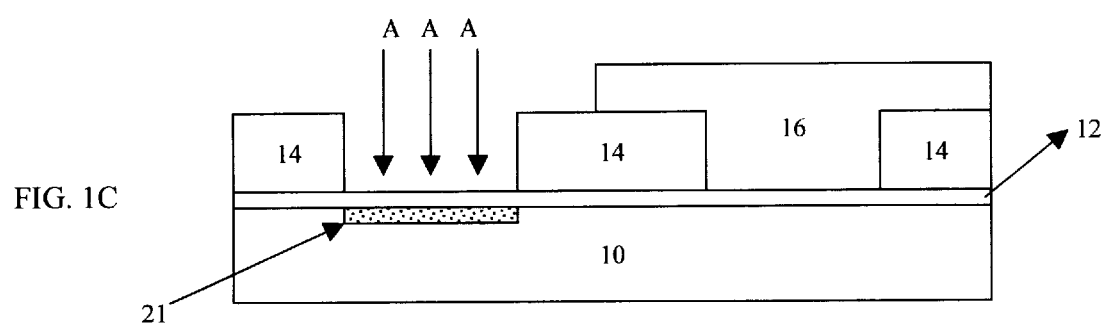
Figure 1D:
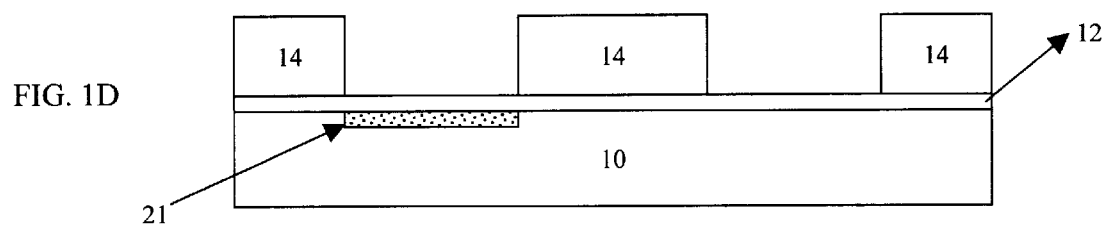
Figure 1E:
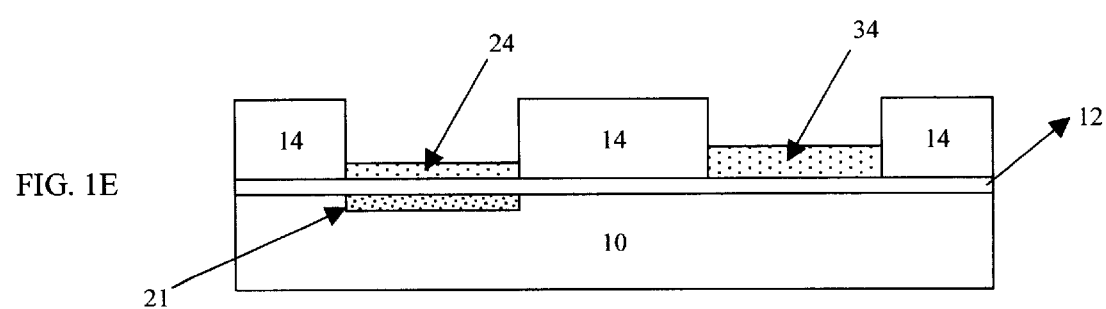
Figure 1F:
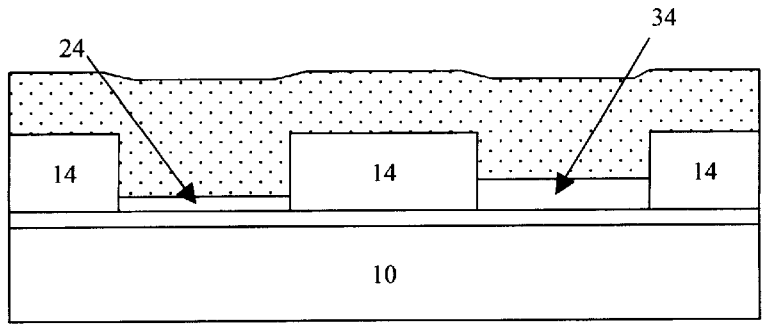
Figure 1G:
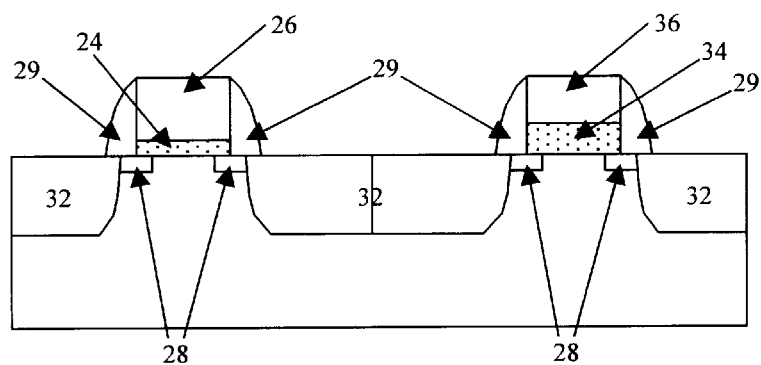
Figure 2A:
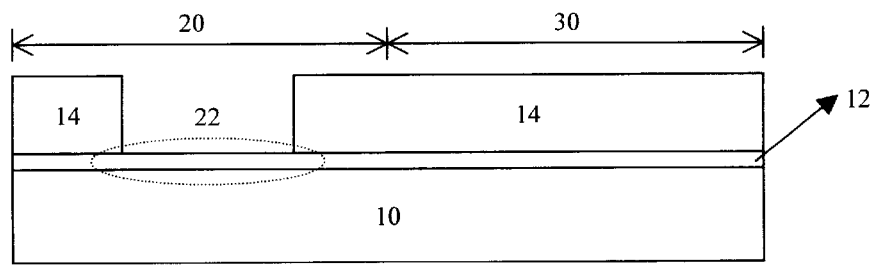
FIGS. 2A to 2E illustrate sequential phases of a method according to another embodiment of the present invention.
Figure 2B:
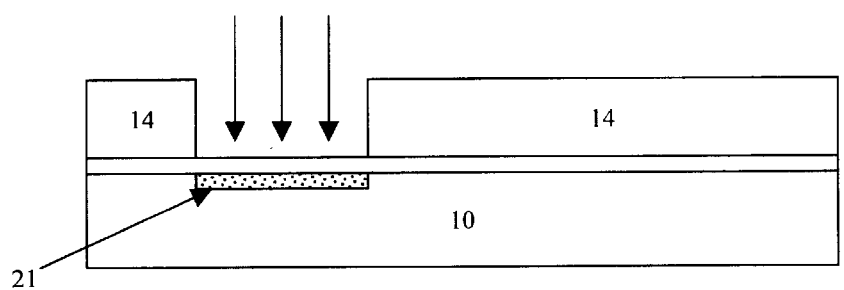
Figure 2C:
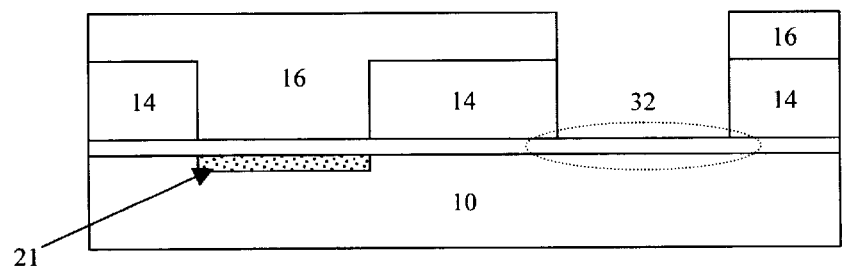
Figure 2D:
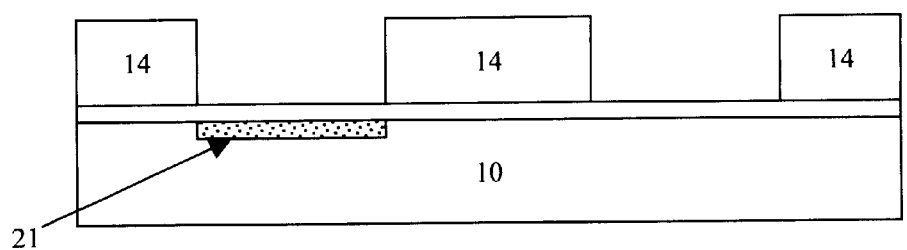
Figure 2E:
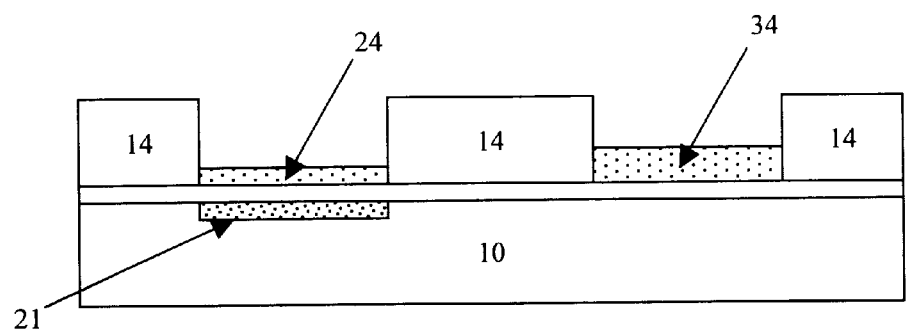

As shown in FIG. 1C, nitrogen is ion implanted in the semiconductor substrate 10, as show by arrows A, e.g., at an implantation dosage of about $1 \times 10^{13}$ atoms $cm^{-2}$ to about $1 \times 10^{18}$ atoms $cm^{-2}$ and at an implantation energy of about 5 KeV to about 100 KeV to form a nitrogen implanted region 21 containing about $1 \times 10^{12}$ atoms $cm^{-3}$ to about $1 \times 10^{16}$ atoms $cm^{-3}$ at the surface portion of the semiconductor substrate underlying the first opening 22 in the logic core portion 20 employing the first PR mask layer 14 and the second mask layer 16 as a mask. After forming the nitrogen implanted region 21, the second mask layer 16 is removed from the surface of the second opening 32, as shown in FIG. 1D.

A gate oxide layer is then formed simultaneously on the surface of the substrate in the first and second openings 22, 32, i.e., in the logic core portion 20 and in the I/O portion 30, by thermal oxidization, as at a temperature of about 800° C. to about 1000° C. for about 3 minutes to about 10 minutes. The implanted nitrogen region 21 formed in the surface of the semiconductor surface underlying the first opening 22 retarding oxidation. It is believed that the implanted nitrogen region 21 prevents the oxidizing species from reaching the silicon substrate during thermal oxidization because oxygen and water vapor diffuse very slowly through the implanted nitrogen. Accordingly, the implanted nitrogen region 21 retards the growth of first gate oxide layer 24 formed in the logic core region 20. Thermal oxidation is then conducted to form gate oxides 24 and 34. Thus, the nitrogen implantation enables the thickness of first gate oxide layer 24 to be optimized for miniaturization, e.g., formed at a thickness of about 20 Å to about 30 Å, while the thickness of second gate oxide 34 formed in the I/O portion 30 is optimized, obtained to withstand a higher voltage, e.g., formed at a thickness of about 35 Å to about 100 Å.

The material processing techniques, such as deposition, photolithographic, and etching techniques, employed in the present invention are those typically employed in manufacturing conventional semiconductor devices and, hence, are not set forth herein in detail.

Thus, by the present invention, a semiconductor device is formed having a differential gate oxide thickness wherein the first gate oxide formed on a nitrogen implanted region has a thickness smaller than the thickness of the second gate oxide. The resulting semiconductor is advantageously characterized by transistor having different gate oxide thickness on the same chip, implemented by simplified manufacturing steps, with an attendant reduction in short channel effect and electrostatic discharge damage in the logic core portion.

The present invention enjoys industrial applicability in various types of semiconductor devices, particularly in semiconductor devices designed for microcomputer system such as microprocessors, microcontrollers, and memory devices, which require high density logic core portion with low internal operation voltage and high voltage input/output portion closely located to an external voltage input or output. The present invention is, therefore, applicable to any CMOS technology.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprising:

forming a first mask on a main surface of a semiconductor substrate exposing a portion of a logic core region and a portion of an input/output (I/O) region;

ion implanting nitrogen into the surface of the semiconductor substrate in the logic core region; and forming a first oxide layer on the nitrogen implanted surface portion of the semiconductor substrate in the logic core region and a second oxide layer on the input/output (I/O) portion of the semiconductor substrate, the second oxide layer having a thickness greater than that of the first oxide layer, the method further comprising forming a pad oxide layer on the surface of the semiconductor substrate before forming the first mask, forming the pad oxide layer comprising forming the pad oxide layer at a thickness of about 5 Å to about 10 Å.

2. A method of manufacturing a semiconductor device, which method comprising:

forming a first mask on a main surface of a semiconductor substrate exposing a portion of a logic core region and a portion of an input/output (I/O) region;

ion implanting nitrogen into the surface of the semiconductor substrate in the logic core region; and forming a first oxide layer on the nitrogen implanted surface portion of the semiconductor substrate in the logic core region and a second oxide layer on the input/output (I/O) portion of the semiconductor substrate, the second oxide layer having a thickness greater than that of the first oxide layer, the method further comprising annealing the semiconductor substrate after ion implantation nitrogen, annealing the semiconductor substrate comprising rapid thermal annealing at a temperature of about 1000° C. to about 1050° C. for about 1 to about 20 seconds in a nitrogen-containing environment.

3. A method of manufacturing a semiconductor device, which method comprising:

forming a first mask on a main surface of a semiconductor substrate exposing a portion of a logic core region and a portion of an input/output (I/O) region;

ion implanting nitrogen into the surface of the semiconductor substrate in the logic core region; and forming a first oxide layer on the nitrogen implanted surface portion of the semiconductor substrate in the logic core region and a second oxide layer on the input/output (I/O) portion of the semiconductor substrate, the second oxide layer having a thickness greater than that of the first oxide layer, wherein the first oxide has the thickness of about 20 Å to about 30 Å.

4. The method according to claim 3, wherein the second oxide layer has a thickness of about 35 Å to about 100 Å.

5. The method according to claim 4, wherein the second oxide layer has a thickness of about 35 Å to about 50 Å.

6. A method of manufacturing a semiconductor device, which method comprising:

forming a first mask on a main surface of a semiconductor substrate exposing a portion of a logic core region and a portion of an input/output (I/O) region;

ion implanting nitrogen into the surface of the semiconductor substrate in the logic core region; and forming a first oxide layer on the nitrogen implanted surface portion of the semiconductor substrate in the logic core region and a second oxide layer on the input/output (I/O) portion of the semiconductor substrate, the second oxide layer having a thickness greater than that of the first oxide layer, forming the first and second oxide layers comprising thermally oxidizing at a temperature of about 800° C. to about 1000° C. for about 3 minutes to about 10 minutes to form the first and second oxide layers.

\* \* \* \* \*